(12) United States Patent
Maimon et al.

(10) Patent No.: US 7,045,383 B2
(45) Date of Patent: May 16, 2006

(54) METHOD FOR MAKING TAPERED OPENING FOR PROGRAMMABLE RESISTANCE MEMORY ELEMENT

(75) Inventors: Jon Maimon, Manassas, VA (US); John Rodgers, Fairfax, VA (US)

(73) Assignees: BAE Systems Information and Ovonyx, Inc, Rochester Hills, MI (US); Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 10/396,587

(22) Filed: Mar. 24, 2003

(65) Prior Publication Data
US 2003/0215978 A1 Nov. 20, 2003

Related U.S. Application Data

(63) Continuation-in-part of application No. 09/955,408, filed on Sep. 19, 2001, now Pat. No. 6,613,604.

(51) Int. Cl.
*H01L 21/00* (2006.01)
(52) U.S. Cl. ..................... 438/95; 438/637; 438/640
(58) Field of Classification Search .............. 438/95, 438/128, 666, 130, 98, 637, 640
See application file for complete search history.

(56) References Cited

U.S. PATENT DOCUMENTS 5,814,527 A * 9/1998 Wolstenholme et al. ....... 438/5
5,942,803 A * 8/1999 Shim et al. ................. 257/774

* cited by examiner

*Primary Examiner*—Phat X. Cao
(74) *Attorney, Agent, or Firm*—Philip H. Schlazer; Marvin S. Siskind

(57) ABSTRACT

A method for making a tapered opening. The defined tapered opening is useful for the fabrication of programmable resistance memory elements. The programmable resistance memory material may be a chalcogenide.

41 Claims, 7 Drawing Sheets

FIG 12C

METHOD FOR MAKING TAPERED OPENING FOR PROGRAMMABLE RESISTANCE MEMORY ELEMENT

RELATED APPLICATION INFORMATION

This application is a continuation-in-part of U.S. patent application Ser. No. 09/955,408 filed on Sep. 19, 2001, U.S. Pat. No. 6,613,604. The disclosure of U.S. patent application Ser. No. 09/955,408 is hereby incorporated by reference herein.

FIELD OF THE INVENTION

The present invention relates generally to electrically operated memory elements. More specifically, the present invention relates to programmable resistance memory elements.

BACKGROUND AND PRIOR ART

Programmable resistance memory elements formed from materials that can be programmed to exhibit at least a high or low stable resistance state are known in the art. Such programmable resistance elements may be programmed to a high resistance state to store, for example, a logic ONE data bit. As well, they may be programmed to a low resistance state to store, for example, a logic ZERO data bit.

One type of material that can be used as the memory material for programmable resistance elements is phase change material. Phase change materials may be programmed between a first structural state where the material is generally more amorphous (less ordered) and a second structural state where the material is generally more crystalline (more ordered). The term "amorphous", as used herein, refers to a condition which is relatively structurally less ordered or more disordered than a single crystal and has a detectable characteristic, such as high electrical resistivity. The term "crystalline", as used herein, refers to a condition which is relatively structurally more ordered than amorphous and has lower electrical resistivity than the amorphous state.

The concept of utilizing electrically programmable phase change materials for electronic memory applications is disclosed, for example, in U.S. Pat. Nos. 3,271,591 and 3,530,441, the contents of which are incorporated herein by reference. The early phase change materials described in the '591 and '441 Patents were based on changes in local structural order. The changes in structural order were typically accompanied by atomic migration of certain species within the material. Such atomic migration between the amorphous and crystalline states made programming energies relatively high.

The electrical energy required to produce a detectable change in resistance in these materials was typically in the range of about a microjoule. This amount of energy must be delivered to each of the memory elements in the solid state matrix of rows and columns of memory cells. Such high energy requirements translate into high current carrying requirements for the address lines and for the cell isolation/address device associated with each discrete memory element.

The high energy requirements for programming the memory cells described in the '591 and '441 patents limited the use of these cells as a direct and universal replacement for present computer memory applications, such as tape, floppy disks, magnetic or optical hard disk drives, solid state disk flash, DRAM, SRAM, and socket flash memory. In particular, low programming energy is important when the EEPROMs are used for large-scale archival storage. Used in this manner, the EEPROMs would replace the mechanical hard drives (such as magnetic or optical hard drives) of present computer systems. One of the main reasons for this replacement of conventional mechanical hard drives with EEPROM "hard drives" would be to reduce the power consumption of the mechanical systems. In the case of lap-top computers, this is of particular interest because the mechanical hard disk drive is one of the largest power consumers therein. Therefore, it would be advantageous to reduce this power load, thereby substantially increasing the operating time of the computer per charge of the power cells. However, if the EEPROM replacement for hard drives has high programming energy requirements (and high power requirements), the power savings may be inconsequential or at best unsubstantial. Therefore, any EEPROM which is to be considered a universal memory requires low programming energy.

The programming energy requirements of a programmable resistance memory element may be reduced in different ways. For example, the programming energies may be reduced by the appropriate selection of the composition of the memory material. An example of a phase change material having reduced energy requirements is described in U.S. Pat. No. 5,166,758, the disclosure of which is incorporated by reference herein. Other examples of memory materials are provided in U.S. Pat. Nos. 5,296,716, 5,414,271, 5,359,205, and 5,534,712 disclosures of which are all incorporated by reference herein.

The programming energy requirement may also be reduced through the appropriate modification of the electrical contacts used to deliver the programming energy to the memory material. For example, reduction in programming energy may be achieved by modifying the composition and/or shape and/or configuration (positioning relative to the memory material) of the electrical contacts. Examples of such "contact modification" are provided in U.S. Pat. Nos. 5341,328, 5,406,509, 5,534,711, 5,536,947, 5,687,112, 5,933,365 all of which are incorporated by reference herein. Examples are also provided in U.S. patent application Ser. No. 09/276,273 the disclosure of which is incorporated herein by reference. Examples are also provided in U.S. patent application Ser. No. 09/620,318 the disclosure of which is incorporated herein by reference. More examples are provided in U.S. patent application Ser. No. 09/677,957 the disclosure of which is incorporated herein by reference. The present invention is directed to novel method of making a programmable resistance memory element.

SUMMARY OF THE INVENTION

An aspect of the present invention is a method of fabricating a second opening, comprising: providing a layer of a first material; forming a layer of a second material over the layer of the first material; forming a layer of a third material over the layer of the second material; forming a first opening in the layer of the third material to expose the second material; forming a sidewall spacer of a fourth material on a sidewall surface of the first opening; removing a portion of the layer of the second material to form a recess in the layer of the second material; and removing the third material, the fourth material and an additional portion of the second material to form the second opening in the layer of the second material to expose the first material.

Another aspect of the present invention is a method of fabricating a memory element, comprising: providing a layer of a first material; forming the layer of the second material over the layer of the first material; forming a layer of a third material over the layer of the second material; forming an opening in the layer of the third material to expose the second material; forming a sidewall spacer of a fourth material on a sidewall surface of the opening; removing a portion of the second material to form a recess in the layer of the second material; removing the third material, the fourth material and an additional portion of the layer of the second material to form an opening in the layer of the second material to expose the first material; and forming a programmable resistance material in the opening of the second material.

DETAILED DESCRIPTION OF THE INVENTION

In the following paragraphs and in association with the accompanying figures, examples of memory devices formed according to embodiments of the invention are presented. Specific embodiments of memory elements and methods of making such memory elements are described below as they might be implemented for use in semiconductor memory circuits. In the interest of clarity, not all features of an actual implementation are described in this specification.

Figure 1:
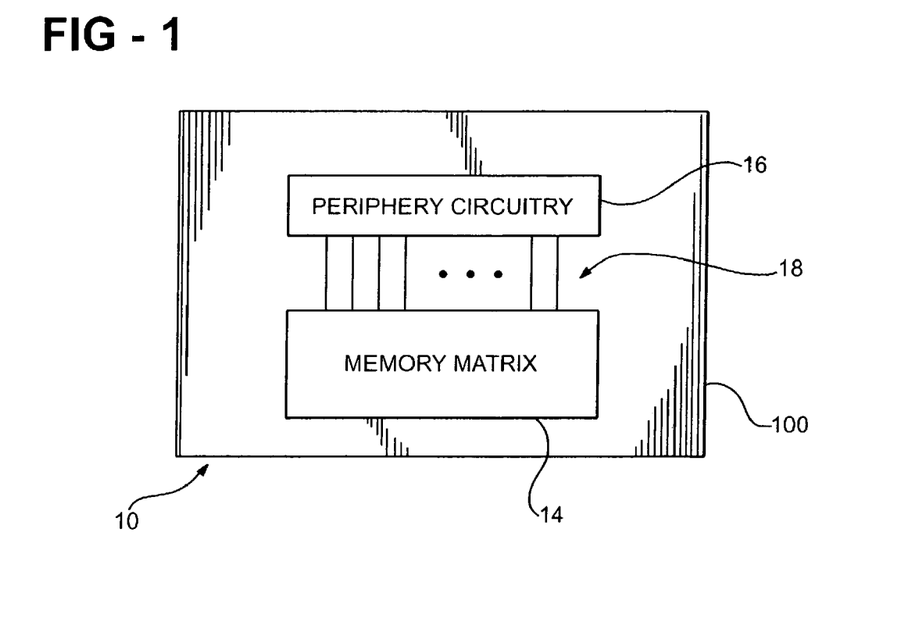
FIG. 1 shows a high-level diagram of a memory device of the present invention including a memory array and periphery circuitry formed on a substrate.

Turning now to the drawings, and referring initially to FIG. 1, a memory device is illustrated and generally designated by a reference numeral 10. The memory device 10 is an integrated circuit memory formed on a semiconductor substrate 100. The memory device 10 includes a memory matrix or array 14 that includes a plurality of memory cells for storing data. The memory matrix 14 is coupled to periphery circuitry 16 by the plurality of control lines 18. The periphery circuitry 16 may include circuitry for addressing the memory cells contained within the memory array 14, along with circuitry for storing data in and retrieving data from the memory cells. The periphery circuitry 16 may also include other circuitry used for controlling or otherwise insuring the proper functioning of the memory device 10.

Figure 2A:
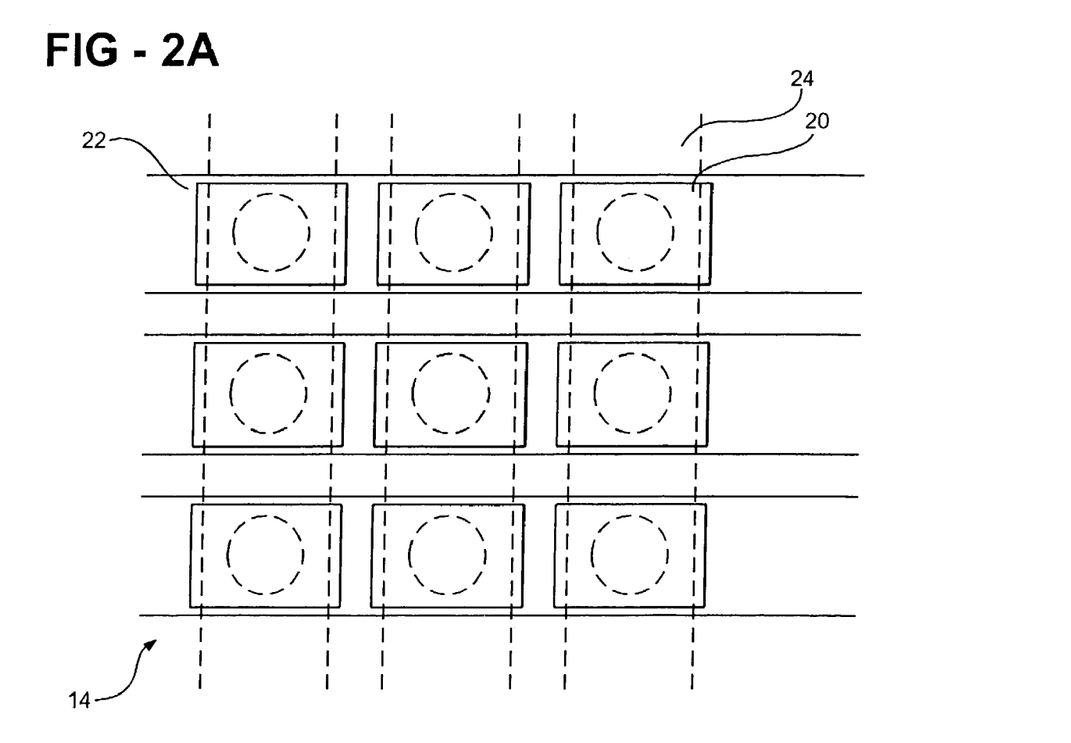
FIG. 2A shows a high-level diagram of a memory array of the present invention.

A top view of the memory array 14 is shown in FIG. 2A. As can be seen, the memory array 14 includes a plurality of memory cells 20 that are arranged in generally perpendicular rows and columns. The memory cells 20 in each row are coupled together by a respective wordline 22, and the memory cells 20 in each column are coupled together by a respective bitline 24.

Figure 2B:
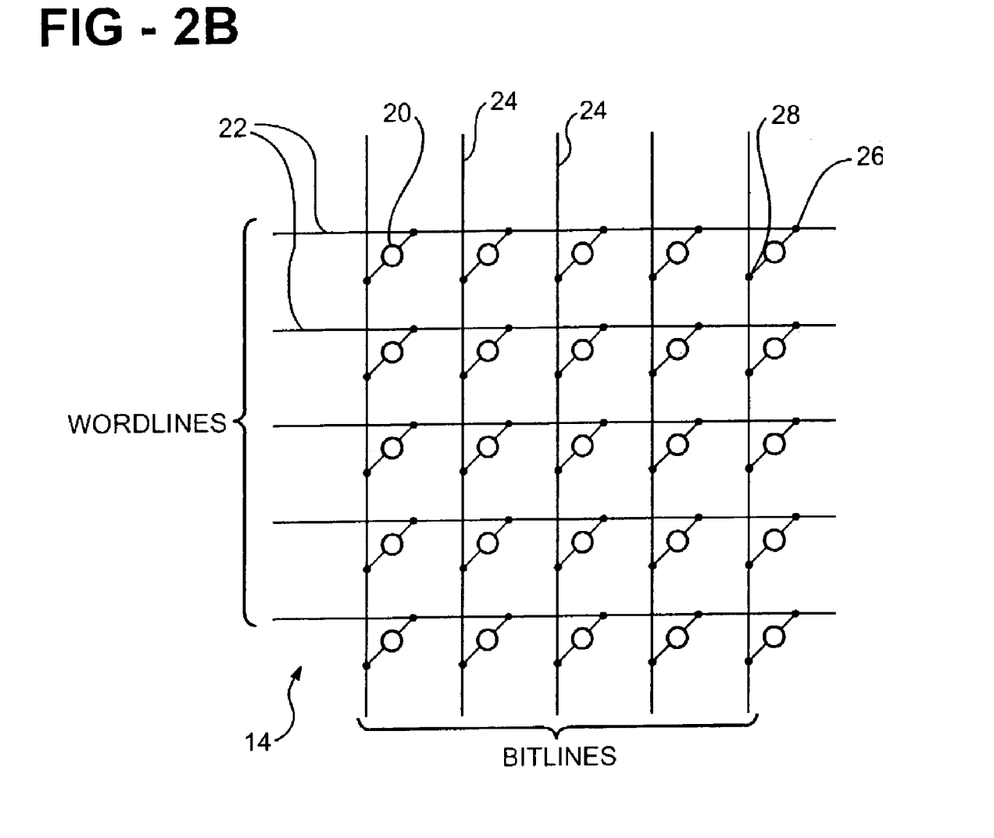
FIG. 2B is a schematic diagram of a memory array of the present invention.

A schematic diagram of the memory array 14 is shown in FIG. 2B. As can be seen, each memory cell 20 includes a wordline node 26 that is coupled to a respective wordline 22, and each memory cell 20 includes a bitline node 28 that is coupled to a respective bitline 24. The conductive wordlines 22 and bitlines 24 are collectively referred to as address lines. These address lines are electrically coupled to the periphery circuitry 16 (shown in FIG. 1) so that each of the memory cells 20 can be accessed for the storage and retrieval of information.

Figure 3:
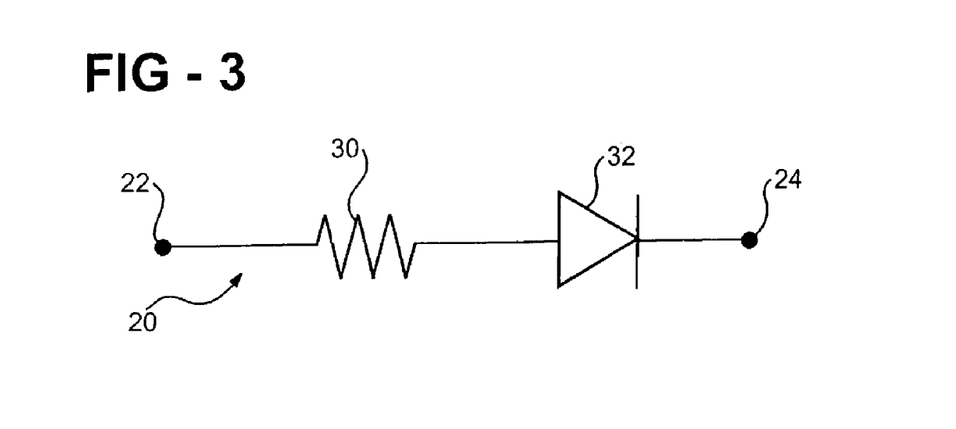
FIG. 3 is a schematic diagram of a memory cell incorporating a programmable resistance memory material.

FIG. 3 illustrates an exemplary memory cell 20 that may be used in the memory array 14. The memory cell 20 includes a memory element 30 which is coupled to an access device 32. The access device electrically isolates each memory element from all other memory elements in the array. In this embodiment, the memory element 30 is illustrated as a programmable resistive element, and the access device 32 is illustrated as a diode. The programmable resistive element may be made of a chalcogenide material, as will be more fully explained below. As illustrated in FIG. 3, the memory element 30 is coupled to a wordline 22, and the access device 32 is coupled to a bitline 24. However, it should be understood that connections of the memory element 20 may be reversed without adversely affecting the operation of the memory array 14.

Figure 10:
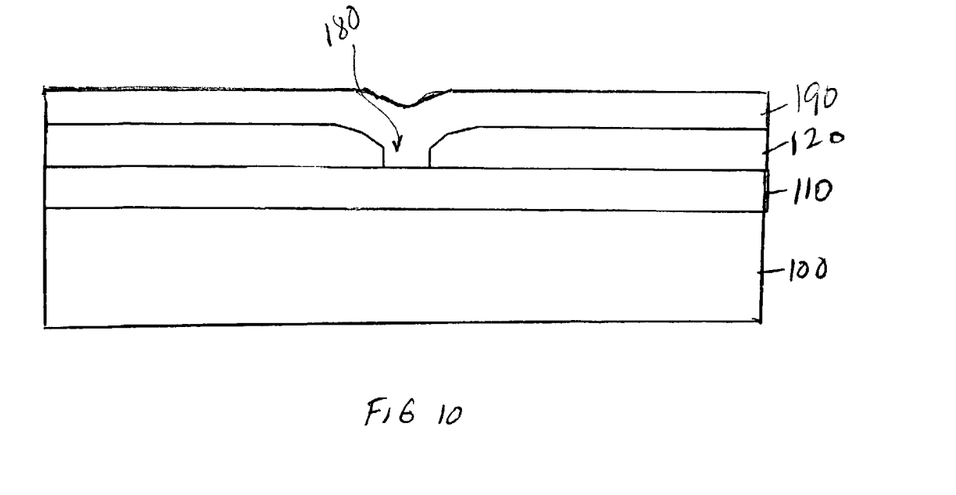
Figure 11:
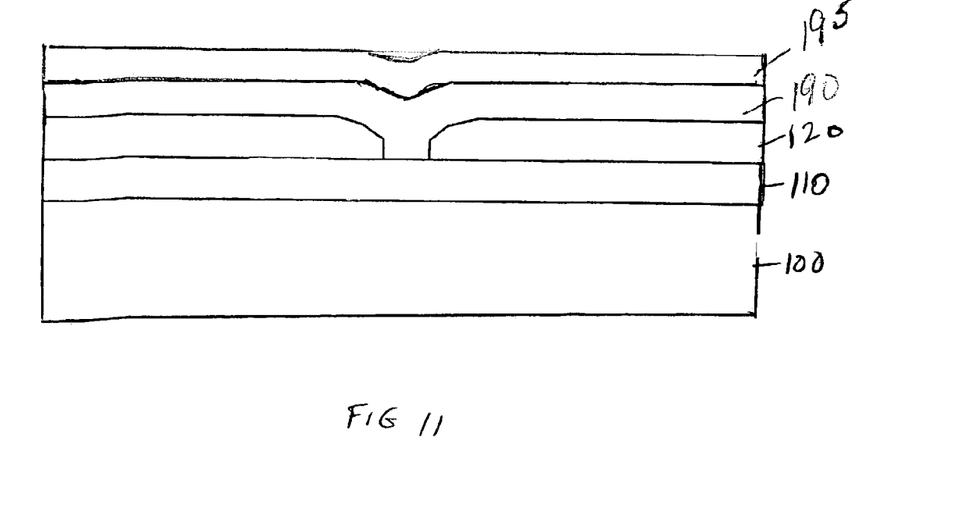

The actual structure of an exemplary memory cell 20 is illustrated in FIG. 11, while a method for fabricating the memory cell 20 is described with reference to FIGS. 4–11. It should be understood that while the fabrication of only a single memory cell is discussed below, a plurality of similar memory cells may be fabricated simultaneously. Although not illustrated, each memory cell is electrically isolated from other memory cells in the array in any suitable manner, such as by the addition of imbedded field oxide regions between each memory cell.

Figure 4:
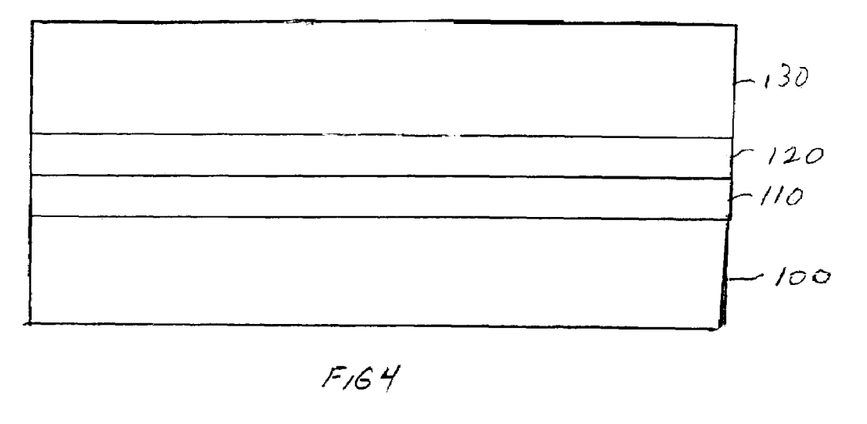
FIGS. 4 through 11 shows an embodiment of the process of the present invention for making a programmable resistance memory element with a tapered opening.

Referring first to FIG. 4, a semiconductor substrate 100 is provided. The substrate 100 may include the access devices as well as the bitlines and/or wordlines. A layer 110 is then deposited on top of the substrate 100. The layer 110 is preferably formed of a conductive material. Any conductive material may be used. Examples of the conductive materials which may be used include, but not limited to, titanium tungsten, titanium nitride, titanium aluminum nitride, titanium carbonitride, titanium silicon nitride, molybdenum, carbon, carbon silicide, tungsten silicide. The layer 110 serves as a first electrode (in this case the bottom electrode) for the memory element.

A layer 120 is then formed over the layer 110 of conductive material. The layer 120 is preferably formed of a dielectric material. The dielectric material may be any dielectric material, such as an oxide or a nitride. The oxide may be silicon dioxide while the nitride may be silicon nitride. The dielectric material is preferably silicon dioxide. The silicon dioxide may be from a TEOS source. The layer 120 of may be formed in any suitable manner, such as by chemical vapor deposition (CVD).

A layer 130 is then formed over the dielectric layer 120. The layer 130 is preferably formed of polysilicon. (However, in other embodiments of the invention it is possible that layer 130 be formed of a dielectric material such as an oxide or a nitride).

Figure 5:
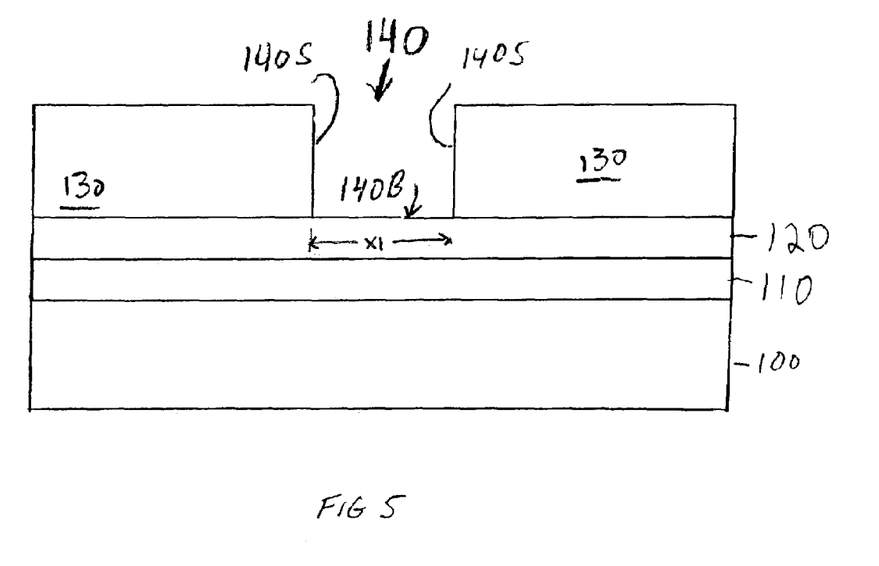

Referring to FIG. 5, an opening 140 is then formed through the polysilicon layer 130 so as to expose a portion of the underlying layer 120 of dielectric material. Generally, the opening 140 may be any shape. For example, the opening 140 may be a hole. The hole may have any shape, and may, for example, be a substantially circular hole, a subtantially square hole, or a rectangular hole. Alternately, the opening 140 may be formed as a trench. Preferably, the opening 140 is formed as a substantially circular hole. The opening 140 includes the sidewall surface 140S about the periphery of the opening and the bottom surface 140B. In the embodiment shown in FIG. 5, the opening is a substantially circular hole. The opening has a minimum lateral dimension $X_1$ (where the lateral dimension is a dimension parallel to the substrate).

Any suitable method of forming the opening 140 may be used. For example, using standard photolithographic techniques, a hard mask (not shown) may be deposited on top of the layer 130 and patterned in the size and shape of the resulting opening 140. The opening 140 may be formed using a conventional contact hole mask. The opening 140 may be formed so that its minimum lateral dimension is at or above the photolithographic limit. Presently, the photolithographic limit is greater than about 1000 Angstroms. In one embodiment, the opening 140 may have a minimum lateral dimension which is greater than about 1300 Angstroms.

As shown in FIG. 5, the opening 140 is preferably formed so that the layer 120 is exposed. Preferably, the opening 140 does not extend into substantially any of layer 120. However, it is also possible to form opening 140 so that it extends through the layer 130 and partially into layer 120 (but does not expose the layer 110).

Figure 6:
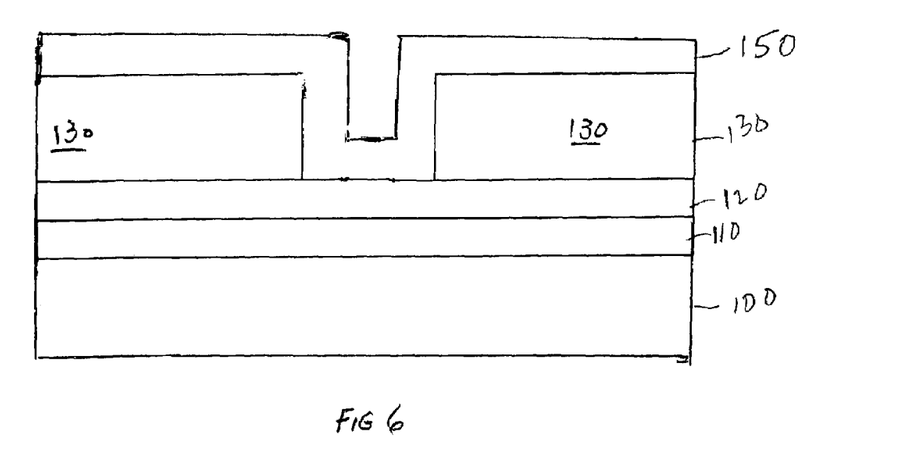

Referring to FIG. 6, a layer 150 is then formed over the sidewall and bottom surfaces of the opening 140. In the embodiment shown in FIG. 6, the layer 150 is formed over the top surface of the layer 130 as well as over the sidewall surface 140S and over the bottom surface 140B of the opening 140. The layer 150 is preferably formed of the same material as layer 130. (However, it is also possible that layer 150 be formed of a different material from layer 130).

The layer 150 is preferably formed of polysilicon. (In other embodiments of the invention, it is possible that the layer 150, like layer 130, may be formed of a dielectric material such as an oxide or a nitride). Preferably, the deposition of layer 150 is a substantially conformal deposition so that the layer 150 of polysilicon preferably has a substantially uniform thickness on the top surface of the layer 130 as well as on the sidewall surface 140S and bottom surface 140B. As shown, the layer 150 of polysilicon lines the sidewall and bottom surface of the opening 140 but does not fill the opening. The layer 150 of polysilicon includes a sidewall layer portion that is formed on the sidewall surface 140S of the opening 140. It also includes a bottom layer portion that is formed on the bottom surface 140B of the opening.

The thickness chosen for the layer 150 may be based on the minimum lateral dimension $X_1$ of the opening 140. For example, the thickness of the layer 150 may be chosen so that it is about one-third the minimum lateral dimension $X_1$ of the opening 140. As an example, if the minimum lateral dimension $X_1$ of the opening 140 is about 3500 Angstroms, then the thickness of the layer 150 may be chosen to be about 1200 Angstroms or less. As another example, if the minimum lateral dimension $X_1$ of the opening 140 is about 1300 Angstroms, then the thickness of the layer 150 may be chosen to be about 500 Angstroms or less. Other thickness values for the layer 150 are possible and the present invention is not limited to any particular thickness value or to any particular way of choosing the thickness value.

Figure 7:
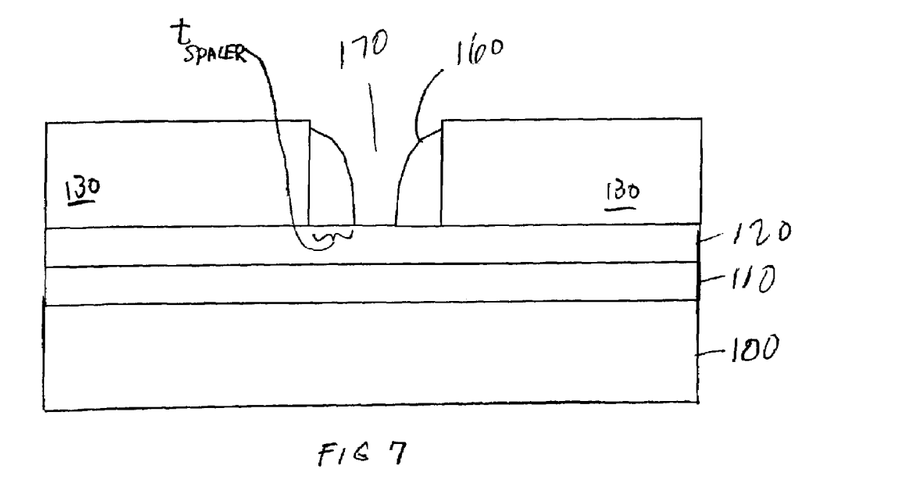

Referring to FIG. 7, the layer 150 of polysilicon is then anisotropically etched so as to remove the horizontally disposed portions of the layer 150. The anisotropic etch removes the horizontally disposed portion of layer 150 that is on the top surface of layer 130. It also removes the horizontally disposed portion of layer 150 that is on the bottom surface 140B of the opening 140. The anisotropic etch leaves a portion of the layer 150 that is disposed on the sidewall surface 140S. The portion of the layer 150 that remains after the anisotropic etch is a sidewall spacer 160 (as shown in FIG. 7) disposed on the sidewall surface 140S. The sidewall spacer 160 of polysilicon is formed over the sidewall surface 140S of the opening 140. If the opening is in the form of a substantially circular hole, then the sidewall spacer 160 is cylindrically shaped (having two open ends).

The bottom of sidewall spacer 160 shown in FIG. 7 has a lateral thickness "$t_{SPACER}$". The thickness of the bottom of the sidewall spacer 160 is substantially equal to the thickness of the layer 150 (shown in FIG. 6) provided that the deposition of the layer 150 is a substantially conformal deposition and that the etch which removes the horizontally disposed portions of layer 150 is a substantially anisotropic etch.

The sidewall spacer 160 reduces the lateral cross-sectional dimension of opening 140 (shown in FIG. 5) so as to form a smaller second opening 170 (shown in FIG. 6). That is, the second opening 170 has a smaller lateral cross-sectional dimension than the opening 140. Since the opening 140 may be sized to have a lateral cross-sectional dimension at the photolithographic limit, it is thus possible that the lateral cross-sectional dimension of the second opening 170 be less than the photolithographic limit. In one embodiment of the invention, the minimum lateral dimension of the second opening 170 may be less than about 1300 Angstroms, preferably less than about 1000 Angstroms, more preferably less than about 600 Angstroms, and most preferably less than about 400 Angstroms.

Referring to FIG. 7, it is seen that the remaining portion of layer 130 of polysilicon in combination with sidewall spacer 160 of polysilicon forms a mask overlying a portion of the layer 120 of dielectric material. That portion of the layer 120 which is exposed is the portion of the layer 120 which is directly underneath the smaller opening 170 and which is thus not covered by the layer 130 or spacer 160 of polysilicon.

Figure 8:
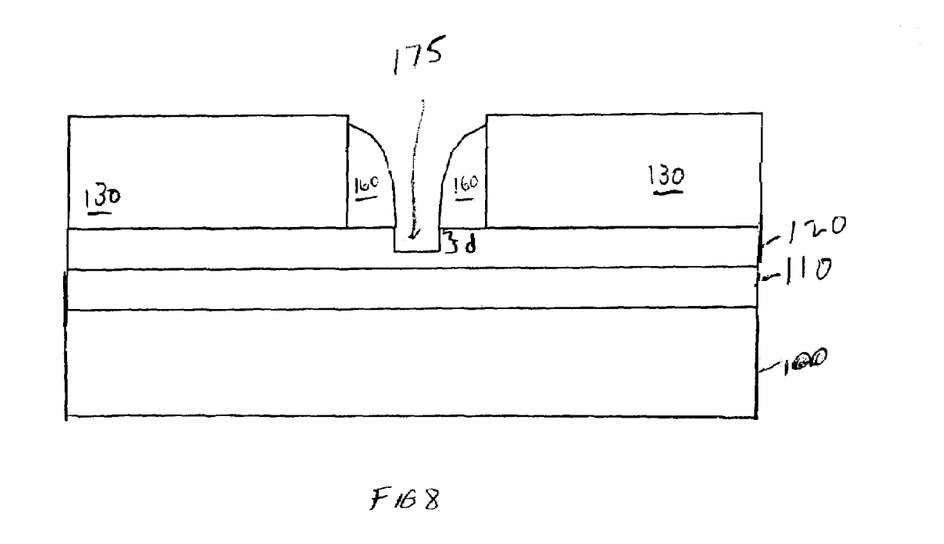

Referring to FIG. 8, the exposed portion of the layer 120 that is underlying the smaller opening 170 is then etched. The etching technique used is preferably an anisotropic etch. The etching process removes a sufficient amount of the dielectric layer 120 to form a recess 180 in the dielectric layer 120. In the formation of the recess 180, the etch stops short of forming a complete opening through the dielectric layer 120. That is, the etch stops short of exposing the underlying layer 110. As shown in FIG. 8, the etch of the dielectric layer 120 creates a recess having a depth "d". The etching step that forms the recess 180 is referred to herein as the "recess forming etch".

Figure 9:
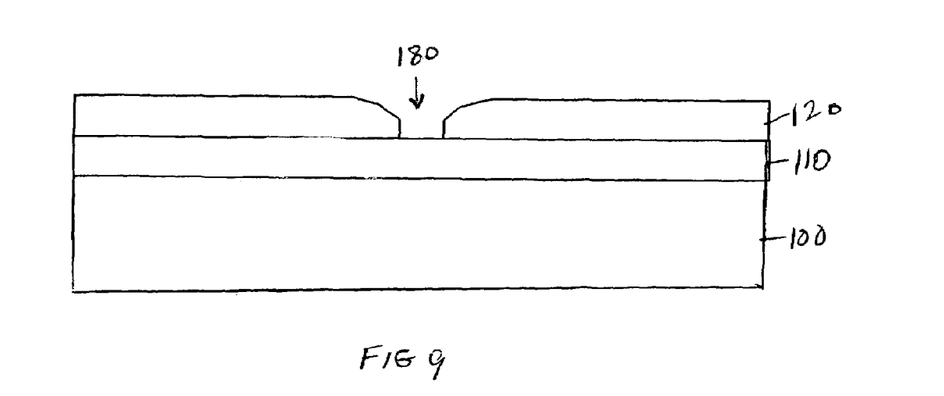

Referring to FIG. 9, the layer 130 of polysilicon as well as the sidewall spacer 160 of polysilicon are then removed. The removal of the layer 130 as well as the sidewall spacer 160 is referred to as the "strip step". The polysilicon material is preferably removed by using a dry etch process. The same dry etch process that is used to remove the polysilicon material of layer 130 and spacer 160 also etches the underlying dielectric material of layer 120. That is, the dry etch process etches (1) the polysilicon material of layer 130 and spacer 160, and (2) the dielectric material of layer 120. The two different materials are preferably etched at different rates. Preferably, the etch process is chosen so that the etch rate r1 of the polysilicon material of layer 130 and spacer 160 is greater than the etch rate r2 of the dielectric material of layer 120. Preferably, the etch process is chosen so that the etch rate of the layer 110 (preferably formed of a conductive material) is negligible. The ratio of the etch rate r1 to the etch rate r2 forms an etch rate ratio R. That is, the etch rate r1 divided by etch rate r2 provides an etch rate ratio R.

The etching process of the strip step etches the recess 175 so that an opening 180 is formed (as shown in FIG. 9) that extends through the dielectric layer 120 and exposes the conductive layer 110. The opening 180 is preferably in the form of a hole. A hole is also referred to as a pore. The pore 180 preferably has a substantially circular cross section. The minimum lateral cross-sectional dimension of the pore 180 is preferably less than 1000 Angstroms, more preferably less than 600 Angstroms and more preferably less than 400 Angstroms.

By varying (1) the depth "d" of the recess 175 (as shown in FIG. 8) in the dielectric layer 120 relative to the thickness of the dielectric layer 120 and/or (2) the etch rate ratio R of the etch rate r1 of the polysilicon material of layer 130 and spacer 160 to the etch rate r2 of the underlying dielectric material of layer 120 during the strip step, it is possible to control the contour of the pore 180.

Figure 12A:
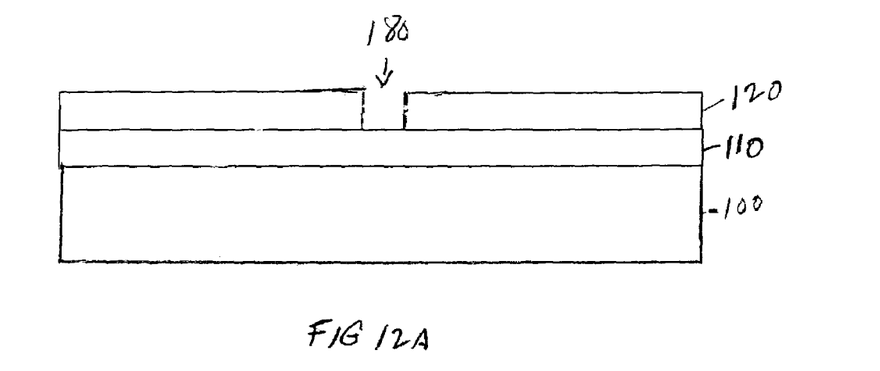
FIGS. 12A through 12C shows examples of three pores having different degrees of taper made by the process of the present invention.
Figure 12B:
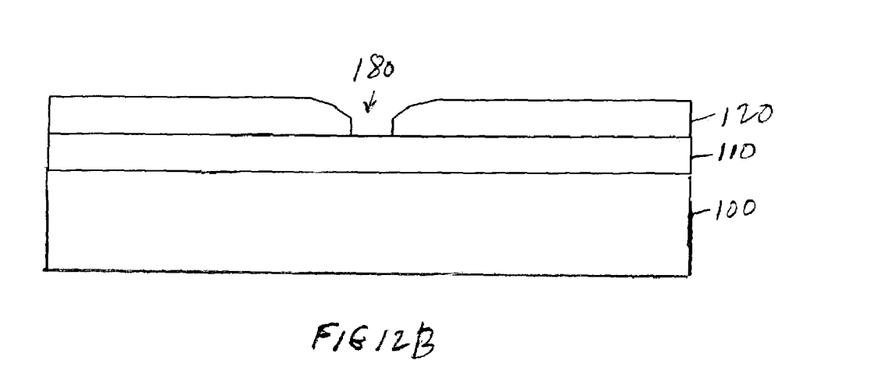
Figure 12C:
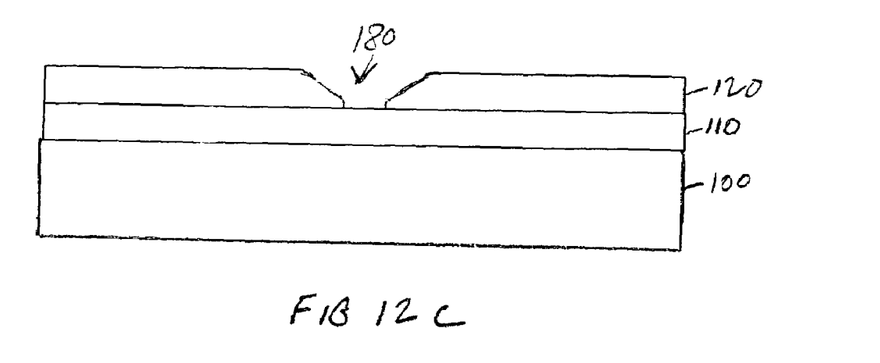

Examples of pore contours are shown in FIGS. 12A–12C. FIG. 12A shows a pore 180 made by using a (1) deep recess forming etch (that is, a recess 175 having a large depth d=d1 relative to the thickness of the layer 120 shown in FIG. 8) and a (2) a high etch ratio R=R1 during the strip step. FIG. 12C shows a pore profile using a (1) shallow recess forming etch (that is, a recess 175 having a shallow depth d=d3 relative to the thickness of the layer 120 shown in FIG. 8) and (2) a low etch ratio R=R3 during the strip step. FIG. 12B shows a pore profile made using (1) a recess having a depth d=d2 with d1>d2>d3 and (2) an etch ratio R=R2 with R1>R2>R3.

Hence, the method of the present invention provides a way to control the contour of the sidewall surface of an opening such as a hole (also referred to as a pore) or a trench. As shown in the FIGS. 12A–C, the pore 180 may be made to taper so that the slope of the sidewall surface of the pore 180 becomes less and less vertical in the direction from the bottom of the pore to the top of the pore. Hence, the minimum lateral cross-sectional dimension is larger at the top of the pore than at the bottom of the pore. The tapering of the pore allows for improved step coverage of the material (such as a programmable resistance material) sputtered into the pore. The slope of a bottom portion of the sidewall surface of the pore may be kept substantially vertical to allow for better control of the area of the exposed underlying conductive layer 110 (e.g. the bottom electrode of the memory element). The exposed surface of the conductive layer 110 is preferably not a strong function of etch time in the strip process.

It is noted that the method of the present invention is applicable to all types of openings, including holes (of all cross-sectional shapes) as well as trenches. Hence, the present invention may be used to control the contour of all types of openings, including holes (of all cross-sectional shapes) as well as trenches.

As an example, in the embodiment in which the material of layer 130 and spacer 160 is polysilicon, the material of layer 120 is a dielectric material formed of TEOS oxide, and the material of layer 110 is a conductive material formed of TiAlN, then an $SF_6/N_2$ etch chemistry may be used during the strip step. This etch chemistry has a negligible etch rate of the TiAlN.

The etch rate ratio R=r1/r2 may be controlled by many factors. Factors include, but not limited to, the type of etchant used as well as the pressure and power of the etchant is applied. The etch rate ratio R=r1/r2 of the etch rate r1 of the material of layer 130 and spacer 160 (preferably polysilicon) to the etch rate r2 of the underlying layer 120 (preferably a dielectric material) is preferably adjusted to be between 2 and 100 (lower and higher ratios are still possible). More preferably, the etch rate ratio R is adjusted to be between 2 and 50. Most preferably, the etch rate ratio R is adjusted to be between 2 and 10. A specific example of an etch rate ratio R is an etch rate ratio of about 5.

Referring again to FIG. 8, the recess 175 is formed that has a depth d. The recess 175 is formed so that the ratio of the depth d of the recess 175 to the thickness of the layer 120 is preferably less than about 0.75, more preferably less than about 0.5, and most preferably less than about 0.4. The ratio of the depth d of the recess 175 to the thickness of the layer 120 may be less than 0.35. In one embodiment of the invention, the ratio of the depth d of the recess 175 to the thickness of the layer 120 is about ⅓ (one-third).

Referring now to FIG. 10, a layer of programmable resistance memory material 190 (preferably a phase-change material and more preferably a chalcogenide material) is then deposited over the dielectric layer 120 and into the pore 180. In the embodiment shown, the memory material 190 fills the pore 180. However, it is also possible that it does not completely fill the pore 180. The memory material may be deposited by methods such as sputtering, evaporation or chemical vapor deposition. A layer 195 is then deposited over the memory material 190 to form an upper electrode for the memory element. Preferably, the layer 195 is formed of a conductive material. The conductive material that is used to form the upper electrode 195 may be formed of the same conductive materials used to form the bottom electrode 110. Examples of a conductive materials that may be used for the upper electrode 195 include titanium tungsten, carbon and titanium nitride.

Referring again to FIG. 7, it is noted a wide range of materials may be utilized for layer 110, layer 120, layer 130, and spacer 160. (Spacer 160 is formed by etching the layer 150 shown in FIG. 6). As described above, layer 130 and spacer 160 may be formed of polysilicon while layer 120 may be formed of a dielectric such as an oxide or a nitride. However, it is also possible that layer 130 and spacer 160 be formed of a dielectric material such as an oxide or a nitride. (The oxide may be silicon oxide while the nitride may be silicon nitride). For example, layer 130 and spacer 160 may be formed of a nitride while the layer 120 may be formed of an oxide. Alternately, layer 130 and spacer 160 may be formed of an oxide while layer 120 may be formed of a nitride. Examples of possible combinations of materials are provided in the table below. The invention is not limited to the examples provided in the table below.

TABLE

|  | layer 120 | layer 130 | spacer 160 |
| --- | --- | --- | --- |
| combination 1 | oxide | polysilicon | polysilicon |
| combination 2 | nitride | polysilicon | polysilicon |
| combination 3 | oxide | nitride | nitride |
| combination 4 | nitride | oxide | oxide |

Regardless of the materials used, it is preferable that the etch process be chosen so that the etch rate r1 of the material of layer 130 and spacer 160 be greater than the etch rate r2 of the material of layer 120. As noted above, the etch rate ratio R (where R=r1/r2) is preferably between 2 and 100, more preferably between 2 and 50, most preferably between 2 and 10. In one embodiment, the etch rate ratio may be between 4 and 6. A specific example of an etch rate ratio is an etch rate ratio R of about 5.

While it is preferable that layer 130 and spacer 160 be formed of the same material, it is also possible that the layer 130 be formed of a material which is different from spacer 160. For example, layer 130 may be formed of one type of oxide while spacer 160 may be formed of another type of oxide. When layer 130 is formed of a material which is different from the spacer 160, it is preferable that the etching process be chosen so that etch rate of layer 130 be greater than the etch rate of layer 120. Likewise, it is preferable that the etching process be chosen so that etch rate of spacer 160 also be greater than the etch rate of layer 120. The etch rate ratio of the etch rate of layer 130 to the etch rate of layer 120 is preferably between 2 and 100, more preferably between 2 and 50, and most preferably between 2 and 10. In one embodiment, the etch rate ratio of layer 130 to layer 120 may be between 4 and 6. A specific example of an etch rate ratio of layer 130 to layer 120 is an etch rate ratio of about 5. Likewise, the etch rate ratio of the etch rate of spacer 160 to the etch rate of layer 120 is also preferably between 2 and 100, more preferably between 2 and 50, and most preferably between 2 and 10. In one embodiment, the etch rate ratio of spacer 160 to layer 120 may be between 4 and 6. A specific example of an etch rate ratio of spacer 160 to layer 120 is an etch rate ratio of about 5.

In addition, while it is preferable that layer 110 be a conductive material, it is possible that layer 110 be formed of a material other than a conductive material. Hence, it is possible that the method of the present invention be used to form an opening (such as a pore) that overlies and exposes a layer formed from a material that is not a conductive material. Preferably, the particular materials selected for each of the layers 110, 120, 130 and 150 (as shown in FIG. 6) will be selected to provide proper selectivity during the various etching processes as will be recognized by persons of ordinary skill in the art.

As noted above, the memory elements of the present invention may be electrically coupled to isolation/selection devices and to addressing lines in order to form a memory array. The isolation/addressing devices permit each discrete memory cell to be read and written to without interfering with information stored in adjacent or remote memory cells of the array. Generally, the present invention is not limited to the use of any specific type of isolation/addressing device. Examples of isolation/addressing devices include field-effect transistors, bipolar junction transistors, and diodes. Examples of field-effect transistors include JFET and MOSFET. Examples of MOSFET include NMOS transistors and PMOS transistors. Furthermore NMOS and PMOS may even be formed on the same chip for CMOS technologies. Hence, associated with each memory element of a memory array structure is isolation/addressing device which serves as an isolation/addressing device for that memory element thereby enabling that cell to be read and written without interfering with information stored in other adjacent or remote memory elements of the array.

The memory element of the present invention comprises a volume of memory material. Generally, the volume of memory material is a programmable resistance memory material which is programmable to at least a first resistance state and a second resistance state. The memory material is preferably programmed in response to electrical signals. Preferably, the electrical signals used to program the materials are electrical currents which are directed to the memory material.

In one embodiment, the memory material is programmable to two resistance states so that each of the memory elements is capable of storing a single bit of information. In another embodiment, the memory material is programmable to at least three resistance states so that each of the memory elements is capable of storing more than one bit of information. In yet another embodiment, the memory material is programmable to at least four resistance states so that each of the memory elements is capable of storing at least two bits of information. Hence, the memory materials may have a range of resistance values providing for the gray scale storage of multiple bits of information.

The memory materials may be directly overwritable so that they can be programmed from any of their resistance states to any other of their resistance states without first having to be set to a starting state. Preferably, the same programming pulse or pulses may be used to program the memory material to a specific resistance state regardless of its previous resistance state. (For example, the same current pulse or pulses may be used to program the material to its high resistance state regardless of its previous state). An example of a method of programming the memory element is provided in U.S. Pat. No. 6,075,719, the disclosure of which is incorporated by reference herein.

The memory material may be a phase change material. The phase-change materials may be any phase change memory material known in the art. Preferably, the phase change materials are capable of exhibiting a first order phase transition. Examples of materials are described in U.S. Pat. Nos. 5,166,758, 5,296,716, 5,414,271, 5,359,205, 5,341,328, 5,536,947, 5,534,712, 5,687,112, and 5,825,046 the disclosures of which are all incorporated by reference herein.

The phase change materials may be formed from a plurality of atomic elements. Preferably, the memory material includes at least one chalcogen element. The chalcogen element may be chosen from the group consisting of Te, Se, and mixtures or alloys thereof. The memory material may further include at least one element selected from the group consisting of Ge, Sb, Bi, Pb, Sn, As, S, Si, P, O, and mixtures or alloys thereof. In one embodiment, the memory material comprises the elements Te, Ge and Sb. In another embodiment, the memory material consists essentially of Te, Ge and Sb.

The memory material may include at least one transition metal element. The term "transition metal" as used herein includes elements 21 to 30, 39 to 48, 57 and 72 to 80. Preferably, the one or more transition metal elements are selected from the group consisting of Cr, Fe, Ni, Nb, Pd, Pt and mixtures or alloys thereof. The memory materials which include transition metals may be elementally modified forms of the memory materials in the Te—Ge—Sb ternary system. This elemental modification may be achieved by the incorporation of transition metals into the basic Te—Ge—Sb ternary system, with or without an additional chalcogen element, such as Se.

A first example of an elementally modified memory material is a phase-change memory material which includes Te, Ge, Sb and a transition metal, in the ratio $(Te_aGe_bSb_{100-(a+b)})_cTM_{100-c}$ where the subscripts are in atomic percentages which total 100% of the constituent elements, wherein TM is one or more transition metals, a and b are as set forth herein above for the basic Te—Ge—Sb ternary system and c is between about 90% and about 99.99%. Preferably, the transition metal may include Cr, Fe, Ni, Nb, Pd, Pt and mixtures or alloys thereof.

A second example of an elementally modified memory material is a phase-change memory material which includes Te, Ge, Sb, Se and a transition metal, in the ratio $(Te_aGe_bSb_{100-(a+b)})_cTM_dSe_{100-(c+d)}$ where the subscripts are in atomic percentages which total 100% of the constituent elements, TM is one or more transition metals, a and b are as set forth hereinabove for the basic Te—Ge—Sb ternary system, c is between about 90% and 99.5% and d is between about 0.01% and 10%. Preferably, the transition metal may include Cr, Fe, Ni, Pd, Pt, Nb, and mixtures or alloys thereof.

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

We claim:

1. A method of fabricating a second opening, comprising:
   providing a layer of a first material;
   forming a layer of a second material over said layer of said first material;
   forming a layer of a third material over said layer of said second material;
   forming a first opening in said layer of said third material to expose said second material, said first opening not extending into substantially any of said layer of said second material;
   forming a sidewall spacer of a fourth material on a sidewall surface of said first opening;
   removing a first portion of said layer of said second material to form a recess in said layer of said second material, said recess does not expose said first material, said recess having a bottom surface consisting essentially of the same material as said first portion of said second material; and
   removing a second portion of said second material to form said second opening in said layer of said second material exposing said first material.

2. The method of claim 1, wherein said second opening is a hole.

3. The method of claim 1, wherein said second opening is a trench.

4. The method of claim 1, wherein said third material and said fourth material are the same material.

5. The method of claim 1, wherein said first material is a conductive material.

6. The method of claim 1, wherein said second material is a dielectric.

7. The method of claim 6, wherein said dielectric comprises an oxide or a nitride.

8. The method of claim 1, wherein said third material and said fourth material are polysilicon.

9. The method of claim 1, wherein said third material and said fourth material are a dielectric.

10. The method of claim 9, wherein said dielectric is an oxide or a nitride.

11. The method of claim 1, wherein the ratio of the depth of said recess of said second layer to the thickness of said second layer is less than 0.5.

12. The method of claim 1, further comprising, after said recess is formed, removing at least a portion of said sidewall spacer so as to decrease the thickness of said spacer.

13. The method of claim 1, further comprising removing at least a portion of said sidewall spacer so as to decrease the thickness of said spacer while removing said second portion of said second material.

14. The method of claim 13, wherein the rate of removal of said sidewall spacer is greater than the rate of removal of said second portion of said second material.

15. The method of claim 1, further comprising removing a third portion of said second material from a sidewall surface of said recess while removing said second portion of said second material.

16. The method of claim 13, further comprising removing a third portion of said second material from a sidewall surface of said recess while removing said second portion of said second material.

17. A method of fabricating a memory element, comprising:
    providing a layer of a first material;
    forming a layer of said second material over said layer of said first material;
    forming a layer of a third material over said layer of said second material; forming a first opening in said layer of said third material to expose said second material, said first opening not extending into substantially any of said layer of said second material;
    forming a sidewall spacer of a fourth material on a sidewall surface of said first opening;
    removing a first portion of said second material to form a recess in said layer of said second material, said recess does not expose said first material, said recess having a bottom surface consisting essentially of the same material as said first portion of said second material;
    removing a second portion of said layer of said second material to form a second opening in said layer of said second material exposing said first material; and
    forming a programmable resistance material in said second opening of said second material.

18. The method of claim 17, wherein said second opening in said layer of said second material is a hole.

19. The method of claim 17, wherein said second opening in said layer of said second material is a trench.

20. The method of claim 17, wherein said third material and said fourth material are the same material.

21. The method of claim 17, wherein said first material is a conductive material.

22. The method of claim 17, wherein said second material is a dielectric material.

23. The method of claim 22, wherein said dielectric is an oxide or a nitride.

24. The method of claim 17, wherein said third material and said fourth material are polysilicon.

25. The method of claim 17, wherein said third material and said fourth material are a dielectric.

26. The method of claim 25, wherein said dielectric is an oxide or a nitride.

27. The method of claim 17, wherein the ratio of the depth of said recess of said second layer to the thickness of said second layer is less thin 0.5.

28. The method of claim 17, further comprising forming a conductive material over said programmable resistance material after forming said programmable resistance material.

29. The method of claim 17, wherein said programmable resistance material is in direct contact with said first material.

30. The method of claim 17, wherein said programmable resistance material is a phase-change material.

31. The method of claim 17, further comprising, after said recess is formed, removing at least a portion of said sidewall spacer so as to decrease the thickness of said spacer.

32. The method of claim 17, further comprising removing at least a portion of said sidewall spacer so as to decrease the thickness of said spacer while removing said second portion of said second material.

33. The method of claim 32, wherein the rate of removal of said sidewall spacer is greater than the rate of removal of said second portion of said second material.

34. The method of claim 17, further comprising removing a third portion of said second material from a sidewall surface of said recess while removing said second portion of said second material.

35. The method of claim 32, further comprising removing a third portion of said second material from a sidewall surface of said recess while removing said second portion of said second material.

36. A method of fabricating an electrical device, comprising:
   providing a layer of a first material;
   forming a layer of said second material over said layer of said first material;
   forming a layer of a third material over said layer of said second material;
   forming a first opening in said layer of said third material to expose said second material, said first opening not extending into substantially any of said layer of said second material;
   forming a sidewall spacer of a fourth material on a sidewall surface of said first opening;
   removing a first portion of said second material to form a recess in said layer of said second material, said recess does not expose said first material, said recess having a bottom surface consisting essentially of the same material as said first portion of said second material;
   removing a second portion of said layer of said second material to form a second opening in said layer of said second material exposing said first material; and
   forming a chalcogenide material in said second opening of said second material.

37. The method of claim 36, further comprising, after said recess is formed, removing at least a portion of said sidewall spacer so as to decrease the thickness of said spacer.

38. The method of claim 36, further comprising removing at least a portion of said sidewall spacer so as to decrease the thickness of said spacer while removing said second portion of said second material.

39. The method of claim 38, wherein the rate of removal of said sidewall spacer is greater than the rate of removal of said second portion of said second material.

40. The method of claim 36, further comprising removing a third portion of said second material from a sidewall surface of said recess while removing said second portion of said second material.

41. The method of claim 38, further comprising removing a third portion of said second material from a sidewall surface of said recess while removing said second portion of said second material.

* * * * *

UNITED STATES PATENT AND TRADEMARK OFFICE
CERTIFICATE OF CORRECTION

| | | |
|---|---|---|
| PATENT NO. | : 7,045,383 B2 | Page 1 of 1 |
| APPLICATION NO. | : 10/396587 | |
| DATED | : May 16, 2006 | |
| INVENTOR(S) | : Jon Malmon and John Rodgers | |

It is certified that error appears in the above-identified patent and that said Letters Patent is hereby corrected as shown below:

Column 1,
Line 12, add the following:
--GOVERNMENT RIGHTS
    This invention was made with Government support under Prime Contract No. F29601-00-D-0244/DO 0002 awarded by the U.S. Air Force.
The Government has certain rights in the invention.--

Signed and Sealed this

Fourteenth Day of November, 2006

JON W. DUDAS
*Director of the United States Patent and Trademark Office*